(12) United States Patent
Pan et al.

(10) Patent No.: US 12,087,659 B2
(45) Date of Patent: Sep. 10, 2024

(54) ELECTRONIC POWER PACKAGE AND HEAT SINK/COLD RAIL ARRANGEMENT

(71) Applicant: DELPHI TECHNOLOGIES IP LIMITED, St. Michael (BB)

(72) Inventors: Binghua Pan, Singapore (SG); Wai Kwan Wong, Kokomo, IN (US); David W. Ihms, Russiaville, IN (US)

(73) Assignee: Delphi Technologies IP Limited, St. Michael (BB)

( * ) Notice: Subject to any disclaimer, the term of this patent is extended or adjusted under 35 U.S.C. 154(b) by 314 days.

(21) Appl. No.: 17/005,376

(22) Filed: Aug. 28, 2020

(65) Prior Publication Data
US 2022/0068753 A1    Mar. 3, 2022

(51) Int. Cl.
*H01L 23/373* (2006.01)
*B22D 19/04* (2006.01)
*H01L 23/367* (2006.01)

(52) U.S. Cl.
CPC .......... *H01L 23/3735* (2013.01); *B22D 19/04* (2013.01); *H01L 23/3677* (2013.01); *H01L 23/3736* (2013.01); *H01L 23/3738* (2013.01)

(58) Field of Classification Search
CPC ................ H01L 23/3735; H01L 23/3677
See application file for complete search history.

(56) References Cited

U.S. PATENT DOCUMENTS

| | | |
|---|---|---|
| 5,410,451 A | 4/1995 | Hawthorne et al. |
| 5,940,271 A | 8/1999 | Mertol |
| 6,563,712 B2 | 5/2003 | Akram et al. |
| 6,812,559 B2 * | 11/2004 | Palm ............... H01L 23/3735 |
| | | 257/691 |
| 6,845,012 B2 | 1/2005 | Ohkouchi |
| 6,873,043 B2 | 3/2005 | Oman |
| 6,943,293 B1 | 9/2005 | Jeter et al. |
| 7,659,615 B2 * | 2/2010 | Oman ............... H01L 23/3128 |
| | | 257/E23.101 |
| 8,945,466 B2 * | 2/2015 | Ishido ................ B22D 19/14 |
| | | 419/14 |
| 2002/0070443 A1 * | 6/2002 | Mu .................... H01L 24/19 |
| | | 257/796 |
| 2020/0262000 A1 * | 8/2020 | Puckett ............. B23K 1/0008 |

FOREIGN PATENT DOCUMENTS

KR     101795812 B1 *  11/2017 ........... H01L 23/373

OTHER PUBLICATIONS

English translation of KR101795812, obtained form EPO espacenet Jan. 31, 2024 (Year: 2024).*

* cited by examiner

*Primary Examiner* — Adam Krupicka
(74) *Attorney, Agent, or Firm* — Joshua M. Haines; Bookoff McAndrews, PLLC

(57) ABSTRACT

An automotive power package includes a heat sink layer fabricated onto at least one surface of the automotive power package. The heat sink layer includes a material having a thermal conductivity higher than 130 W/m-K and a coefficient of thermal expansion between 5 and 15 ppm/° C.

14 Claims, 4 Drawing Sheets

CTE: Cu=17.8 ppm/°C
Al=23.6 ppm/°C

CTE: AlN=4.7 ppm/°C
SiN=3 ppm/°C

CTE: Cu=17.8 ppm/°C
Al=23.6 ppm/°C 1-time bonding

ELECTRONIC POWER PACKAGE AND HEAT SINK/COLD RAIL ARRANGEMENT

TECHNICAL FIELD

This disclosure relates to power packages used in automotive applications and has particular, but not exclusive, application to power packages used in electric or hybrid vehicles.

BACKGROUND OF THE INVENTION

In automotive applications, electronic components which generate large amounts of heat such as power transistors (MOSFETS) and such are typically provided integrated in a power package. An example is in power invertors which are used to provide power for motors. One or more power components such as power transistors (FETs) can be provided in an integrated circuit and the term "power package" should be interpreted as any package or unit which contains one or more such power IC or other power component such as e.g. power (FET) transistors.

In order to cool such power packages, in examples of known heat generating high power IC packages, such as Viper and Scorpion used in vehicle applications, are assembled onto a heatsink or a cold trail, with single or double side cooling (i.e. with a heat sink/cold rail on one or both sides of a generally flat power package), using a thermal interface material (TIM) and/or bonding material.

Currently, such packages are attached to Al/Cu cold rails with double cooling using soft type thermal interface material (TIM) e.g. phase change material (PCM).

This thermal system has limitations. Firstly, the bulk thermal conductivity of the TIM is primarily dependent upon the TIM filler content and its ability to transfer heat filler particle to filler particle. These TIMs typically provide <10 W/m-K thermal conductance. Another problem is TIM pump-out, it is difficult to retain TIM during thermal cycling and vibration, which can lead to reliability failure. Moreover, when TIM is vertically applied or placed, there is a concern over the life of the product regarding its squeezed-out material dropping off and causing short circuit conditions if it contains electrically conducting fillers or constituents.

In light of the limitations of thermal systems using soft TIM like PCM, hard joint thermal interface material (TIM) is therefore considered. TIM hard joint, such as soldering, conductive adhesive, sintering Ag, transient liquid phase sintering (TLPS), fusion bonding, etc., can definitely improve thermal conductivity and has no flowing-out issues.

However, hard joint TIM has its trade-off. Current designs of packages use substrates constructed of e.g. aluminum nitride (AlN) as the base substrate, with direct bond aluminum or direct bond copper attached to the ceramic substrate. Alternatively, packages use silicon nitride (SiN) as the base substrate. Both nitrides are electrical insulating. The direct bond aluminum or copper becomes the electrical conductor of the assembly at internal layers and both external layers act as thermal conductors transferring heat away through TIM to reach cold rails. However, premature failure can happen to the hard joint TIM thermal system during thermal cycling due to there being a mismatch in the thermal coefficient of expansion between the Al/Cu based cold rail and power package (e.g. Viper) ceramic substrates e.g. AlN or SiN, etc.

A further problem is that a Cu or Al cold rail bends and warps easily; this impacts assembly/mounting pressure distribution and hence TIM bond line evenness. This problem will accelerate with temperature cycling and vibration during vehicle on-road lifetime.

SUMMARY OF THE INVENTION

An automotive power package is provided which includes a heat sink layer fabricated onto at least one surface of the automotive power package, the heat sink layer comprises a material having a thermal conductivity higher than 130 W/m-K, and a coefficient of thermal expansion between 5 and 15 ppm/° C.

BRIEF DESCRIPTION OF DRAWINGS

The present invention is now described by way of example with reference to the accompanying drawings in which.

DETAILED DESCRIPTION OF THE PREFERRED EMBODIMENTS

Prior Art

In the prior art, the power package is connected to a cold rail (heat sink) generally of aluminum or copper via a thermal interface layer.

The silicon or silicon carbide integrated IC component of the power package is the heat source. These IC components (devices) are connected to a metalized surface of a ceramic substrate portion, the metal may be typically either aluminum or copper. The ceramic substrate may be either aluminum nitride or silicon nitride or oxide etc.

The metal/metalized layer is relatively thin and is well bonded to the ceramic substrate. The adhesion/bonding is remarkable in that the metal doesn't delaminate from the low CTE ceramic during thermal mechanical stress.

The heat pathway is: silicon or silicon carbide die (heat generation) to solder (or in future implementations silver sinter) to metalized ceramic surface (aluminum or copper) to ceramic substrate (aluminum nitride or silicon nitride) to final metalized ceramic surface of the power package to TIM to cold rail—copper or aluminum.

Invention

In examples of the invention, a heat sink (or cold rail) in the form of e.g. a layer is located next to (i.e. adjacent) or onto the power package; where the heat sink is comprised of an "intermediate" material having a good thermal conductivity, high stiffness, light weight and a coefficient of thermal expansion that is closer matched to the power package substrate which is used. In particular, the heat sink has a stiffness greater than 26 GPa·cm³/g.

Such a heat sink material preferably comprises aluminum silicon carbide (AlSiC) or equivalent. AlSiC is a composite material, and can be fabricated by introducing variable amount of silicon carbide into aluminum matrix/vehicle. The exact composition may be varied; i.e. by variation of the aluminum to silicon carbide ratio, which provides the advantage that the coefficient of thermal expansion can be varied. The material also has very high thermal conductivity and stiffness. An advantage of this material is having a CTE that is between metal and the ceramic substrate, and so a further more traditional metal layer can be applied to the e.g. AlSiC layer, to form a composite heat sink/cold rail.

So a layer of such material can be provided i.e. layered or located onto one or more surfaces of the power package, optionally with a thin bonding or thermal interface layer between. Optionally, at least one layer of metal can be added to this layer (distal to the power package) to form a composite heat sink/cold rail.

The layer of intermediate material may not be complete but may comprises a number, i.e. an array of elements (e.g. flat elements or mini layer components) partially covering the respective power package surface.

As mentioned, optionally a layer of material used in conventional cold rails can be further placed onto the e.g. AlSiC layer referred to above, such as copper or aluminum, distal to the power package.

Figure 1:
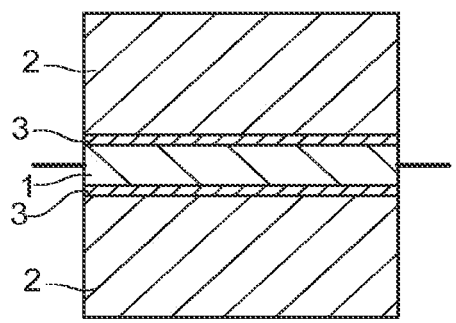
FIG. 1 shows a prior art example of a power package arrangement.

FIG. 1 shows a prior art example of an arrangement showing a power package 1 in thermal contact with a cold rail/heat sink layer 2 (here arranged on both sides of the power package) via a TIM/bonding layer 3. The cold rail 2 is typically made from aluminum or copper (Al/Cu) or an alloy of one or both of these metals.

The power package is usually fabricated from AlN/SiN or other ceramic.

The figure shows typical values of the coefficient of thermal expansions of the materials for the cold rail and power package. Copper has a coefficient of thermal expansion of about 18 ppm/° C. and aluminum 23.6 ppm/° C. The power package of AlN or SiN has coefficient of thermal expansion of around 4.7 and 3 ppm/° C. respectively. Thus, there is a mismatch between Cu/Al and AlN of between 13 to 19 ppm/° C. and between Cu/Al and SiN of 15 to 21 ppm/° C.

In aspects of the invention, materials which have a high thermal conductivity, high stiffness and coefficient of thermal expansion nearer to that of the ceramic power package/substrate (e.g. AlN/SiN) such as AlSiC or equivalent, are applied to the power package (e.g. via a TIM/bonding layer) to act as a heat sink/cold rail e.g. as a layer on one or both sides of a flat power package.

Such material (e.g. AlSiC or equivalent) may form the whole cold rail/heat sink layer (on one or more sides of the power package) or may be integrated into known arrangement such that the e.g. AlSiC, layer is located/sandwiched, between the AlN/SiN power package and a conventional metal cold rail/heat sink layer comprising of Al or CU for example. That is to say, there is a layer of the intermediate material between the power package and a metal e.g. Al/Cu layer. Such arrangement does not produce a sharp discontinuity of the coefficient of thermal expansion between the adjacent layers.

Figure 2:
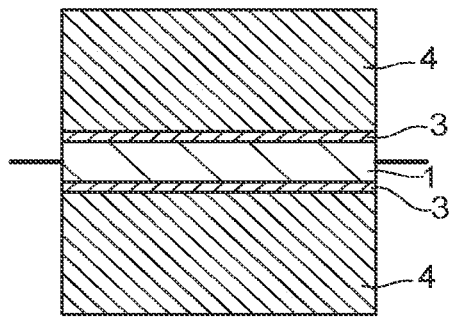
FIGS. 2 and 3 show two examples of the invention.
Figure 3:
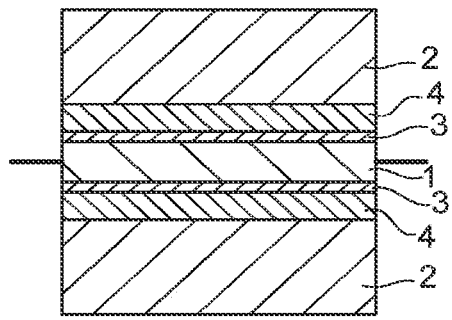

FIGS. 2 and 3 show two examples of the invention.

In FIG. 2 is shown one example where a power package 1 is in thermal contact with a cold rail/heat sink layer 4 (here arranged again on one or both sides of the power package via a TIM/bonding layer 3) and where the cold rail/heat sink layer 4 comprises a AlSiC.

So effectively, the cold rail/heat sink layer is typically of an intermediate material (e.g. AlSiC or equivalent) with high thermal conductivity, high stiffness. The AlSiC has a coefficient of thermal expansion of about 6-14 ppm/° C. and so has a better match with the power package 1.

FIG. 3 shows an alternative where the cold rail/heat sink (on each side) is fabricated from two portions or layers; a first layer 4 in contact with the power package 1 via TIM 3, comprises a layer of intermediate material (typically AlSiC or equivalent) again with a high thermal conductivity, high stiffness, and also a second layer 2 of more traditional heat sink/cold rail material such as Al/Cu, located on the first layer 4, i.e. on the distal side(s) (distally) with respect to the power package. So applied to the layer 4 is located the Al/Cu layer 2.

So in example materials (e.g. AlSiC), with a coefficient of thermal expansion (CTE) variable in between the CTE of AlN/SiN and Al/Cu, are provided as the cold rail or are integrated into composite cold rail/heat sink with traditional heat sink/cold rail materials such as Al/Cu.

The examples provide coefficient of thermal expansion matching power package (e.g. Viper) substrate AlN/SiN as whole cold rail. So the cold rail may comprise AlSiC on its own or there may be an integration of AlSiC or such like material in a composite cold rail, the cold rail including Al/Cu in a distal layer (portion).

The AlSiC may be integrated onto the Al/Cu cold rail (thus forming a composite cold rail/heat sink) with or without a cavity or recess in the cold rail as will be explained hereinafter.

There may be one-time bonding (e.g. soldering, welding, brazing etc.) during cold rail production, where the AlSiC is integrated with the Cu/Al cold rail surface.

Figure 4A:
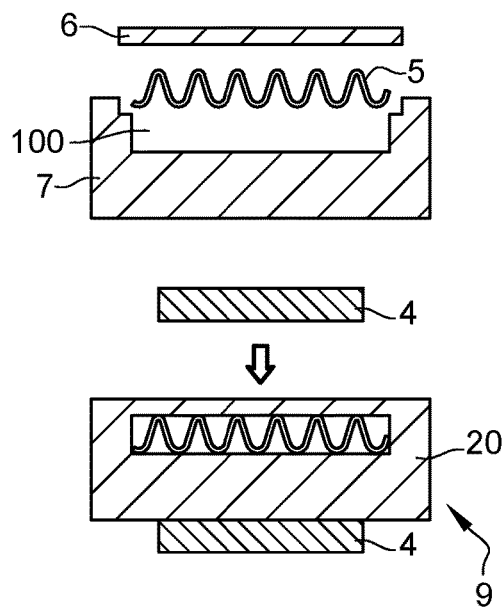
FIGS. 4a and 4b show examples of how a composite cold rail/heat sink can be fabricated according to examples.
Figure 4B:
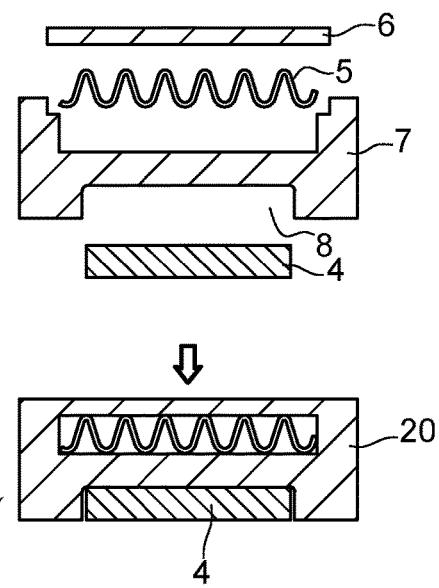

FIGS. 4a and 4b show examples of how a composite cold rail/heat sink can be fabricated according to examples. FIGS. 4a and 4b also show examples of how cooling fins or pins 5 can be formed into a recess 100 in a cold rail 20 portion between a cover 6 and a base 7 component of the cold rail portion 20. The cold rail portion (e.g. base/cover and/or fins) may be formed from CU/Al material as is usual. A layer of the intermediate material is added onto the cold rail portion 20.

In the example of FIG. 4a, an AlSiC layer 4 is formed on the underside of the base of the rail portion (base) 7 i.e. on the base of cold rail portion 20 and in FIG. 4b the AlSiC layer is formed in a recess 8 in the bottom of the base 7, i.e. on the base of cold rail portion 20.

The bottom portions of FIGS. 4a and 4b show the finished composite cold rail/heatsink 9. The fins or pins 5 aid cooling. AlSiC layers with high stiffness help stiffen the cold rail 9 and help minimize cold rail bending or warpage.

Figure 5A:
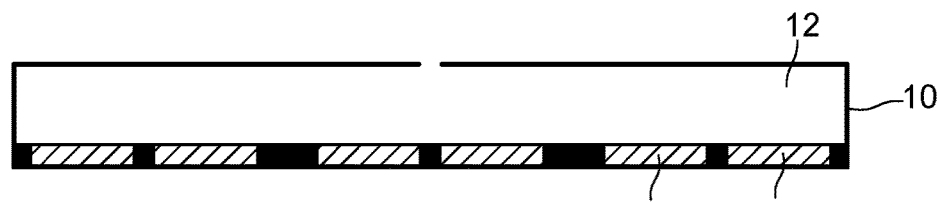
FIGS. 5a, 5b, and 5c illustrate a method of fabrication according to one example.
Figure 5B:
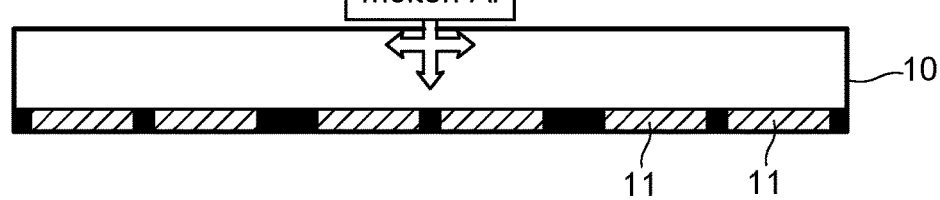
Figure 5C:
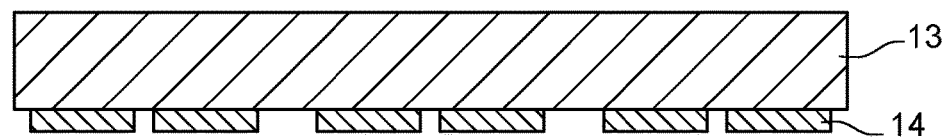

FIGS. 5a, 5b, and 5c illustrate a method of fabrication according to one example where AlSiC is integrated into the base of Al (or Cu) cold rail to form a composite rail without the need of bonding process and material (e.g. soldering, welding, brazing etc.). No additional joint interface needs to be introduced.

Here SiC preforms 11 are placed into a mold cavity 12 of mold 10 in a first step shown in FIG. 5a. Next, the mold is closed, and molten Al is infiltrated into the cavity. Thereafter is formed the (integrated Al—AlSiC) cold rail comprising the Al layer 13 and the AlSiC layer portions 14. The AlSiC layer portions 14 are thus formed by the SiC mixing/fusing with the Al.

AlSiC is a composite material and the composition can vary as the ratio of SiC and Aluminum can be varied.

Figure 6A:
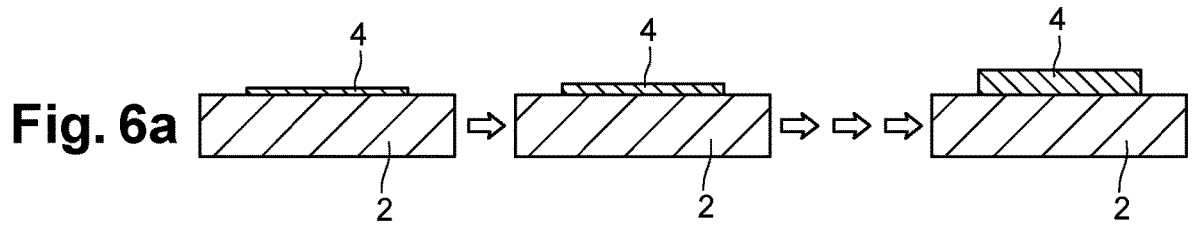
FIGS. 6a and 6b show further examples of the fabrication.
Figure 6B:
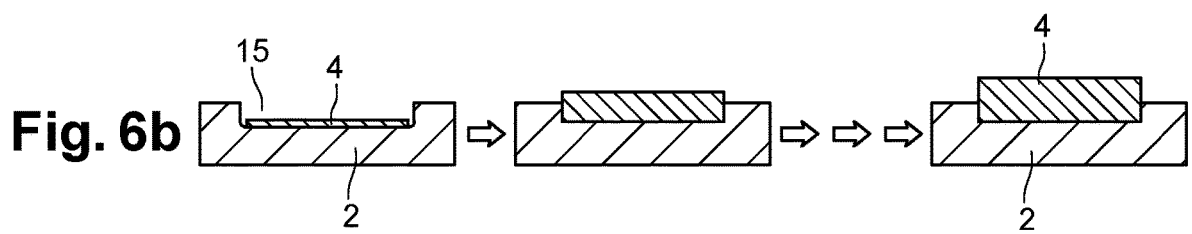

FIGS. 6a and 6b show a further examples of the fabrication of a cold rail/heat sink formed from traditional (e.g. Al/Cu) layers 2 and an AlSiC layer 4. In FIGS. 6a and 6b there is a direct build-up of AlSiC 4 onto Al/Cu cold rail/layer 2 either in portions or layers onto a surface (top) of a cold rail of Cu/Al (FIG. 6a), or built up within a recess 15 in the layer 2, as shown in FIG. 6b. Here the build-up of AlSiC is directly onto a traditional cold rail 2 to the required dimensions and thickness and no joint interface will be introduced in the resultant composite cold rail/heat sink. It should be noted that for the purpose of the invention the terms "heat sink" and "cold rail" are interchangeable.

FIGS. 7a, 7b, 8a, and 8b show further embodiments showing fabrication of a power package and cold rail/heat sink assembly according to examples.

Figure 7A:
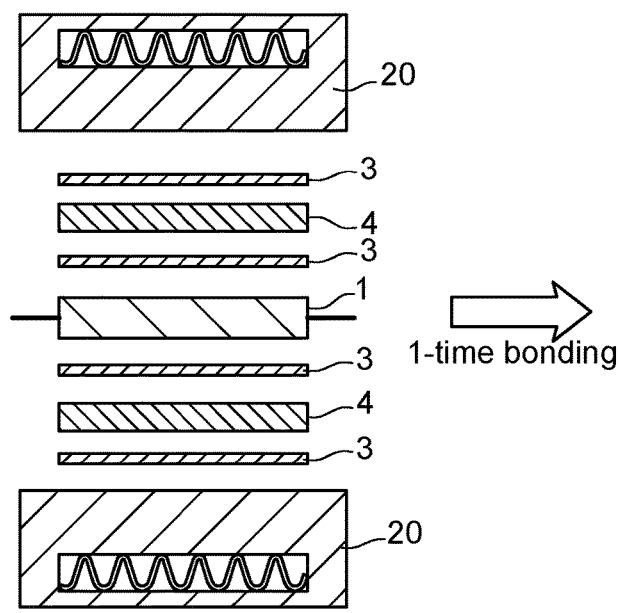
FIGS. 7a, 7b, 8a, and 8b show further embodiments showing fabrication of a power package and cold rail/heat sink assembly according to examples.
Figure 7B:
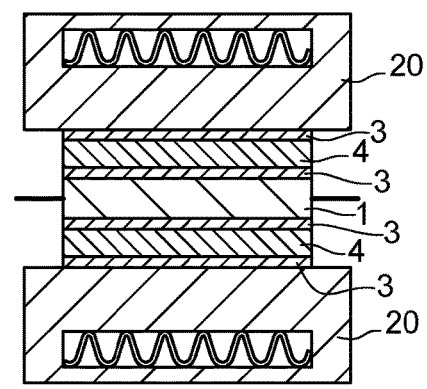

FIG. 7a shows layers used in the fabrication and FIG. 7b shows the final product in one example. The power package 1 is sandwiched between two layers 4 of loose/separate AlSiC via a bonding material 3 which may be regarded also as a thermal interface layer, particularly hard joint type, and is thermally conductive, strong and reliable. Applied to both distal sides of the sides of the AlSiC layers 4 is a further cold rail 20 (portion or heat sink layer) comprising Cu/Al material and may include ribs or fins as in the FIG. 4 examples. Reference numerals refer to like components of previous figures. The end result is a composite heat rail. The skilled person would be aware that in this and other examples, such an arrangement may be applied to/be located on just one rather than two sides of the power package 1.

Here the rail full system integration/bonding (with separate AlSiC, no pre-bonding as shown in FIGS. 4a, 4b, 5a, 5b, 5c, 6a and 6b are needed) which provides a one-time bonding; the bonding material and TIM can be either same or different.

Figure 8A:
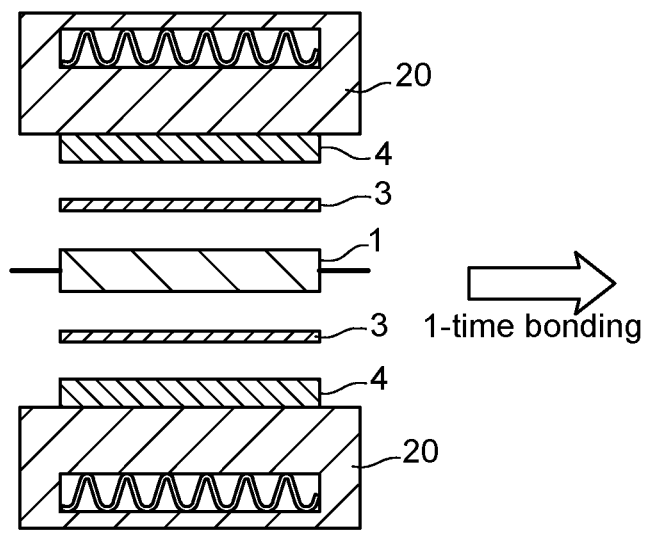
Figure 8B:
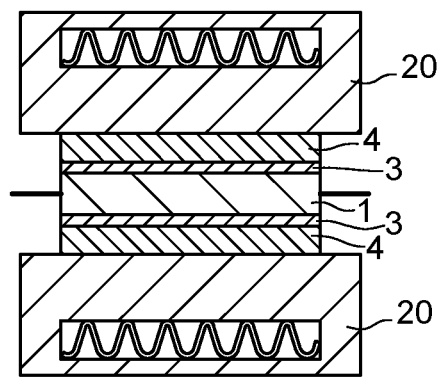

FIGS. 8a and 8b show a process similar to the FIGS. 7a and 7b; here are provided cold rail portions (of Cu/Al construction) with AlSiC layers built up on them (i.e. pre-created), as described above with reference the techniques described with reference to FIGS. 4a, 4b, 5a, 5b, 5c, 6a and 6b. The power package 1 is sandwiched via TIM/bonding material 3 and the AlSiC layers 4 of two cold rails (Cu/Al)/AlSiC pre-forms (composite cold rails).

The skilled person would be aware of other examples falling within the scope of the invention. There may be variable AlSiC or AlSiC type layers having variable dimensions and patterns. The types of AlSiC or equivalent intermediate material can be selected with variable coefficients of thermal expansion, dimensions and thickness so as for optimum performance so as to e.g. to minimize stress induced to the overall structure.

Figure 9A:
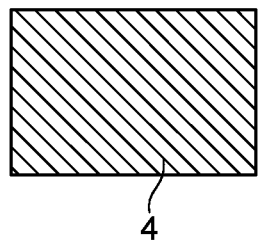
FIGS. 9a, 9b, and 9c show further examples.
Figure 9B:
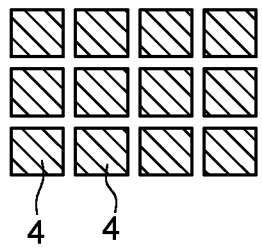
Figure 9C:
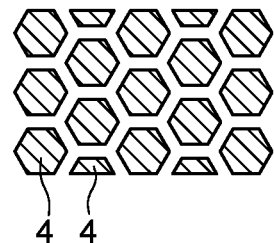

The pattern of AlSiC layer formed on the cooling rail surface may be of any form and cover the whole area of the surface or one or more portions thereof. So the layer may not be complete but may comprise a number of an array of elements (e.g. flat elements or mini layer components) partially covering the respective power package surface. Various patterns are shown in FIGS. 9a, 9b, and 9c where FIG. 9a shows a complete layer, FIG. 9b shows rectangular elements and FIG. 9c shows hexagonal elements.

Although the above examples have been described with reference to AlSiC as the intermediate material; other materials may be used.

As mentioned, the CTE of such intermediate materials (e.g. AlSiC) is preferably between 5 and 15 ppm/° C., and further preferably between 6 and 11 ppm/° C. and the thermal conductivity higher than 130 W/m-K, preferably higher than 165 W/m-K.

Table 1 below shows the typical values of CTE and thermal conductivity for common heat sink layer materials (Al, Cu) in the first two rows and power package materials (last two rows). The other rows show values for the intermediate materials which can be used as heat sink layers according to aspects of the invention. High stiffness and light weight are also important characteristics.

TABLE 1

| Material | CTE PPM/° C. | Thermal conductivity W/m-K |
| --- | --- | --- |
| aluminum | 23.6 | 210 |
| copper | 16.9 | 400 |
| AlSiC | 6.5-9.5 | 170-200 |
| Mo70Cu | 9.1 | 170 |
| W/Cu | 8.3 | 190 |
| Mo | 5.4 | 138 |
| Tungsten | 4.4 | 173 |
| AlN | 3.6-4.6 | 285 |
| SiN | 3.7 | 90 |

The best match material is (16.9+3.7)/2=10.3 ppm/° C. for copper or (23.6+3.7)/2=13.7 ppm/° C. for aluminum.

Mo70Cu is a particular alloy of molybdenum and copper. Any suitable alloy of molybdenum or copper may be used.

We claim:

1. An automotive power package including a ceramic power package, a first heat sink layer, and a second heat sink layer,
   the first heat sink layer being fabricated onto a first surface of said ceramic power package of the automotive power package, the first heat sink layer including a first layer comprising aluminum silicon carbide (AlSiC), and the first layer being fabricated to the first surface of said ceramic power package of the automotive power package by a first bonding layer or thermal interface material,
   the second heat sink layer being fabricated onto a second surface of said ceramic power package of the automotive power package, the second heat sink layer being fabricated to the second surface of said ceramic power package of the automotive power package by a second bonding layer or thermal interface material, and
   said first heat sink layer comprising a material having a thermal conductivity higher than 130 W/m-K, and a coefficient of thermal expansion between 5 and 15 ppm/° C.

2. The automotive power package as claimed in claim 1, wherein said coefficient of thermal expansion is between 6 and 11 ppm/° C.

3. The automotive power package as claimed in claim 1, wherein said thermal conductivity is higher than 165 W/m-K.

4. The automotive power package as claimed in claim 1, wherein said AlSiC is formed by fusing aluminum with silicon carbide.

5. The automotive power package as claimed in claim 1, further comprising a third heat sink layer including molybdenum/copper alloy, tungsten/copper alloy, molybdenum, tungsten, or alloys of molybdenum, tungsten or copper distal to said ceramic power package.

6. The automotive power package as claimed in claim 1, wherein said first heat sink layer has a stiffness greater than 26 GPa·cm³/g.

7. An automotive power package including a ceramic power package and two heat sink layers, the two heat sink layers being fabricated onto two respective surfaces of said ceramic power package, said heat sink layers each including a first heat sink layer comprising of aluminum silicon carbide (AlSiC) and being bonded to the ceramic power package by a thin bonding or thermal interface material, said heat sink layers comprising a material having a thermal conductivity higher than 130 W/m-K, and a coefficient of thermal expansion between 5 and 15 ppm/° C.

8. The automotive power package as claimed in claim 7, wherein said coefficient of thermal expansion is between 6 and 11 ppm/° C.

9. The automotive power package as claimed in claim 7, wherein said heat sink layers include a second heatsink layer, said second heat sink layer being comprised of different material fabricated onto said first heat sink layer, distal to said ceramic power package.

10. A method of fabricating an automotive power package including a ceramic power package and two heat sink layers, the method comprising:
    fabricating a first heat sink layer onto a first surface of said ceramic power package, said first heat sink layer comprising a first layer comprising aluminum silicon carbide (AlSiC) that is bonded to the first surface of the ceramic power package by a first bonding or thermal interface material, and
    fabricating a second heat sink layer onto a second surface of said ceramic power package that is bonded to the second surface of the ceramic power package by a second bonding layer or thermal interface material,
    wherein the AlSiC has a thermal conductivity greater than 130 W/m-K and a coefficient of thermal expansion between 5 and 15 ppm/° C.

11. The method as claimed in claim 10, the method further comprising fabricating a third heat sink layer including molybdenum/copper alloy, tungsten/copper alloy, molybdenum, tungsten, or alloys of molybdenum, tungsten or copper.

12. The method as claimed in claim 11, wherein the third heat sink layer comprises substantially of aluminum or copper.

13. The method as claimed in claim 10, wherein said AlSiC is formed by fusing aluminum with silicon carbide.

14. The method as claimed in claim 13, wherein said AlSiC is formed by fusion of molten aluminum with silicon carbide.

* * * * *